United States Patent
Dasgupta et al.

(10) Patent No.: US 9,054,695 B2
(45) Date of Patent: Jun. 9, 2015

(54) TECHNIQUE TO REALIZE HIGH VOLTAGE IO DRIVER IN A LOW VOLTAGE BICMOS PROCESS

(71) Applicant: Texas Instruments Incorporated, Dallas, TX (US)

(72) Inventors: Samiran Dasgupta, Bangalore (IN); Devraj Matharampallil Rajagopal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/043,535

(22) Filed: Oct. 1, 2013

(65) Prior Publication Data

US 2015/0091616 A1 Apr. 2, 2015

(51) Int. Cl.
*H03K 19/0175* (2006.01)
*H03K 19/018* (2006.01)

(52) U.S. Cl.
CPC .. *H03K 19/01818* (2013.01); *H03K 19/017518* (2013.01)

(58) Field of Classification Search
CPC .......... G11C 5/14; G11C 8/08; H03K 17/667; H03K 19/001; H03K 19/0136; H03K 19/01818; H03F 3/3067; H03F 3/3001
USPC ........................ 326/62–64, 66, 68, 73, 75–78; 327/108–112, 318–333, 538–543
See application file for complete search history.

(56) References Cited

U.S. PATENT DOCUMENTS

| | | | | |
|---|---|---|---|---|
| 3,654,490 A * | 4/1972 | Kan | | 326/80 |
| 4,471,241 A * | 9/1984 | Nagano | | 326/79 |
| 4,810,908 A * | 3/1989 | Suzuki et al. | | 327/306 |
| 4,998,026 A * | 3/1991 | King | | 326/16 |
| 5,065,051 A * | 11/1991 | Matsumoto | | 326/78 |
| 5,475,343 A * | 12/1995 | Bee | | 330/255 |
| 5,587,677 A * | 12/1996 | Samani | | 327/108 |
| 5,631,580 A * | 5/1997 | Rau | | 326/66 |
| 5,825,228 A * | 10/1998 | Gross | | 327/333 |
| 5,933,055 A * | 8/1999 | Dosho | | 330/255 |
| 6,373,295 B2 * | 4/2002 | Kadanka et al. | | 327/108 |
| 7,098,692 B2 * | 8/2006 | Joshi et al. | | 326/62 |
| 7,307,469 B2 * | 12/2007 | Yamada et al. | | 327/540 |
| 7,327,164 B2 * | 2/2008 | Wang | | 326/77 |
| 7,885,125 B2 * | 2/2011 | Hirabayashi | | 365/189.11 |

* cited by examiner

*Primary Examiner* — Alexander H Taningco
*Assistant Examiner* — Kurtis R Bahr
(74) *Attorney, Agent, or Firm* — John R. Pessetto; Frank D. Cimino

(57) ABSTRACT

An IO circuit capable of high voltage signaling in a low voltage BiCMOS process. The IO circuit includes a voltage rail generator circuit that receives a reference voltage and generates a voltage rail supply. A BJT (bi-polar junction transistor) buffer circuit is coupled to the voltage rail generator circuit and a pad. The BJT buffer circuit includes a pull-up circuit and a pull-down circuit. The pull-up circuit receives the voltage rail supply. The pull-down circuit is coupled to the pull-up circuit. The pad is coupled to the pull-up circuit and the pull-down circuit.

20 Claims, 3 Drawing Sheets

US 9,054,695 B2

TECHNIQUE TO REALIZE HIGH VOLTAGE IO DRIVER IN A LOW VOLTAGE BICMOS PROCESS

TECHNICAL FIELD

Embodiments of the disclosure relate generally to input/output (IO) drivers for integrated circuits (ICs) and more particularly to implementing a high voltage IO driver in a low voltage BiCMOS process.

BACKGROUND

An integrated circuit (IC) includes core logic circuits and input/output (IO) circuits. The core logic circuits perform a desired function and require a low voltage termed as core supply. The IC communicates with other ICs or external devices (filters, sensors etc.) at high voltage range termed as the IO voltage. The IO circuits acts as an interface between core logic circuits and external devices. An IO circuit includes a driver that drive signals on a pad to interface with the external devices. A bidirectional IO circuit has a driver used for sending signals to the external devices (Transmission mode) and a receiver for receiving signals from the external devices (Receive mode). High voltages are applied at the pad to test the IO circuits (Test mode). HDD (hard disk drive) preamplifier is one of the many application areas of IO circuits. Preamplifier is an important component found in all hard drives or magnetic drives. It amplifies the signal received from the head and transmits the amplified and reconditioned signal to the hard drive SOC (silicon-on-chip). The preamplifier relies on IO drivers to communicate the data from the preamplifier to the SOC. Preamplifiers are built on BiCMOS process that works on 5V supply voltage and supports 1.8/2.5/3.3 signaling modes. The new generation preamplifiers are built on 3V BiCMOS process, while still having to support the same 5V supply voltage and 1.8/2.5/3.3 signaling modes. The 3V BiCMOS process has 3V bipolar devices and 1.8V MOS device as the only regular MOS transistor. The lack of high voltage devices makes the use of standard CMOS available IO topologies particularly unsuited to meet the requirements of 5 V supply voltage and 3.3 voltage signaling levels.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides an input/output (IO) circuit. The IO circuit includes a voltage rail generator circuit that receives a reference voltage and generates a voltage rail supply. A BJT (bi-polar junction transistor) buffer circuit is coupled to the voltage rail generator circuit and a pad. The BJT buffer circuit includes a pull-up circuit and a pull-down circuit. The pull-up circuit receives the voltage rail supply. The pull-down circuit is coupled to the pull-up circuit. The pad is coupled to the pull-up circuit and the pull-down circuit.

An example embodiment provides a method of implementing a high voltage IO circuit in a low voltage BiCMOS process. The method includes generating a voltage rail supply from a reference voltage. A current is injected in a second PNP transistor to activate the second PNP transistor when an input signal transitions from logic-LOW to logic-HIGH. A pad is charged to the supply rail voltage. A current is injected in a second NPN transistor to activate the second NPN transistor when the input signal transitions from logic-HIGH to logic-LOW and the pad is discharged to a ground voltage.

Another embodiment provides a computing device. The computing device includes a processing unit, a memory module coupled to the processing unit and a plurality of logic circuits coupled to the processing unit and the memory module. An IO circuit is coupled to at least one logic circuit of the plurality of logic circuits. The IO circuit includes a voltage rail generator circuit that receives a reference voltage and generates a voltage rail supply. A BJT (bi-polar junction transistor) buffer circuit is coupled to the voltage rail generator circuit and a pad. The BJT buffer circuit includes a second PNP transistor configured to receive the voltage rail supply. A second NPN transistor is coupled to the second PNP transistor. The pad is coupled to the second PNP transistor and the second NPN transistor. A first base current supply circuit and a first charge injection circuit are coupled to the second PNP transistor. The first base current supply circuit and the first charge injection circuit receive an input signal. A second base current supply circuit and a second charge injection circuit are coupled to the second NPN transistor. The second base current supply circuit and the second charge injection circuit receive the input signal. A blocking diode is coupled between the second PNP transistor and the second NPN transistor.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
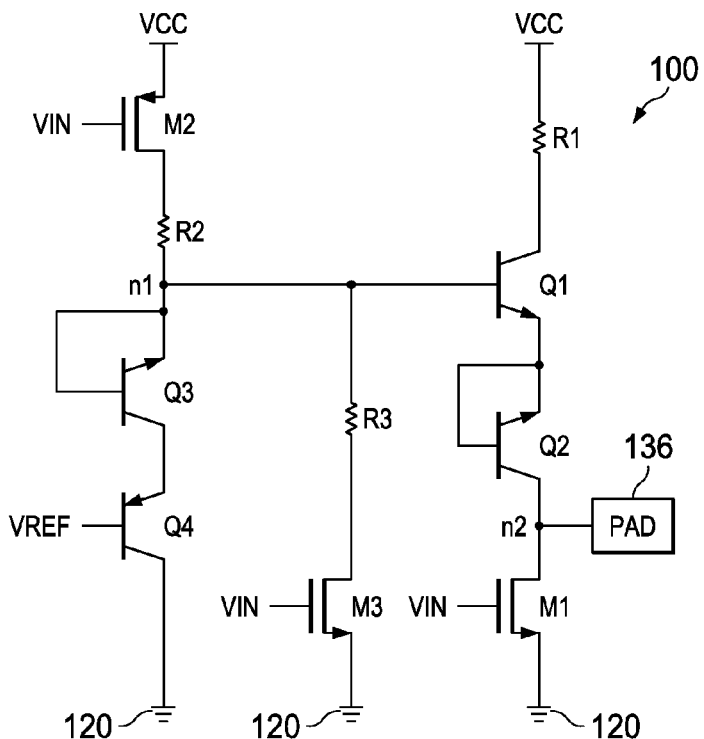
FIG. 1 illustrates a schematic of an input/output (IO) circuit.

FIG. 1 illustrates a schematic of an input/output (IO) circuit 100. The IO circuit 100 is powered by a supply voltage VCC. In one embodiment, supply voltage VCC is equal to 5 volt. The IO circuit 100 also receives an input signal Vin and a reference voltage Vref. A p-channel MOSFET M2 is powered by supply voltage VCC and receives input signal Vin at a gate terminal. A drain terminal of the p-channel MOSFET M2 is coupled to a resistor R2. The resistor R2 is coupled to node n1. A diode connected NPN transistor Q3 is coupled to a node n1. An emitter terminal of the diode connected NPN transistor Q3 is shorted to a base terminal of the diode connected NPN transistor Q3. A PNP transistor Q4 is coupled to the diode connected NPN transistor Q3. A collector terminal of the diode connected NPN transistor Q3 is coupled to an emitter terminal of the PNP transistor Q4. The PNP transistor Q4 receives the reference voltage Vref at a base terminal. A collector terminal of the PNP transistor Q4 is coupled to a ground terminal 120. A resistor R3 is coupled to node n1. An n-channel MOSFET M3 is coupled to the resistor R3 and receives the input signal Vin at a gate terminal. A resistor R1 receives the supply voltage VCC. An NPN transistor Q1 is coupled to the resistor R1. A base terminal of the NPN transistor Q1 is coupled to node n1. A diode connected NPN transistor Q2 is coupled to the NPN transistor Q1. An emitter terminal of the NPN transistor Q1 is coupled to an emitter terminal of the diode connected NPN transistor Q2. The emitter terminal of the diode connected NPN transistor Q2 is shorted to a base terminal of the diode connected NPN transistor Q2. A collector terminal of the diode connected NPN transistor Q2 is coupled to a node n2. An n-channel MOSFET M1 is coupled to the node n2. The MOSFET M1 receives the input signal Vin at a gate terminal. A pad 136 is coupled to the node n2. Source terminals of the n-channel MOSFET M3 and n-channel MOSFET M1 are coupled to the ground terminal 120.

The operation of the IO circuit 100 illustrated in FIG. 1 is explained now. In one embodiment, in a 5V BiCMOS process, the supply voltage VCC is equal to 5 volt and the input signal Vin swings from 0 to 5V. In 5V BiCMOS process, the reference voltage Vref may be 1.8V, 2.5V or 3.3V (depending on signaling modes). During pull-up i.e. when the input signal Vin transitions from logic-LOW to logic-HIGH, p-channel MOSFET M2 is activated and n-channel MOSFET M1 is inactivated. A current flow through p-channel MOSFET M2, diode connected NPN transistor Q3 and PNP transistor Q4. If voltage drop across each base-emitter junction of each bipolar transistor in IO circuit 100 is Vbe, a voltage developed at node n1 is (Vn1=Vref+2Vbe), where Vn1 is the voltage developed at node n1. The voltage developed at node n2 is given as:

$$Vn2 = Vn1 - 2Vbe \quad (1)$$

$$Vn2 = Vref + 2Vbe - 2Vbe \quad (2)$$

$$Vn2 = Vref \quad (3)$$

Thus, the pad 136 is pulled to reference voltage Vref. The p-channel MOSFET M2 provides a base current to NPN transistor Q1.

During pull-down i.e. when the input signal Vin transitions from logic-HIGH to logic-LOW, p-channel MOSFET M2 is inactivated and n-channel MOSFET M1 is activated. The n-channel MOSFET M3 is also activated which pulls the node n1 to a ground potential (or 0 volt), thus inactivating NPN transistor Q1. As MOSFET M1 is activated, the pad is pulled to the ground potential through the ground terminal 120. The diode connected NPN transistor Q2 acts as a blocking device to protect the base-emitter junction of NPN transistor Q1 from high voltage at the pad when the IO circuit 100 is not driving signal or the IO circuit 100 is in tri-state mode (test mode or receive mode). In one embodiment, during test mode, the voltage applied to the pad is around 5 volt. A high reverse emitter base voltage is created on the NPN transistor Q1 if the diode connected NPN transistor Q2 is not present thus causing overstress on the NPN transistor Q1.

The MOSFETs, the NPN transistors and the PNP transistors in IO circuit 100 are 5 volt devices and can be used only in 5V BiCMOS process and are not available in 3V BiCMOS process. The 3V BiCMOS process supports only 1.8V MOS transistors and 3V bipolar transistors. The 3V BiCMOS process also supports 5V drain-extended MOS (DEMOS). However, DEMOS is not suited for fast switching applications. The drain capacitance of the DEMOS makes it ineffective to support rise and fall time required by high frequency of operations such as frequency of 100 MHz. Also, the IO circuit 100 fails to address the over-voltage reliability issue when used in 3V BiCMOS process. Even when DEMOS are used instead of MOSFETs in IO circuit 100, the NPN transistor Q1 is exposed to high collector emitter overvoltage which damages the NPN transistor Q1.

Figure 2:
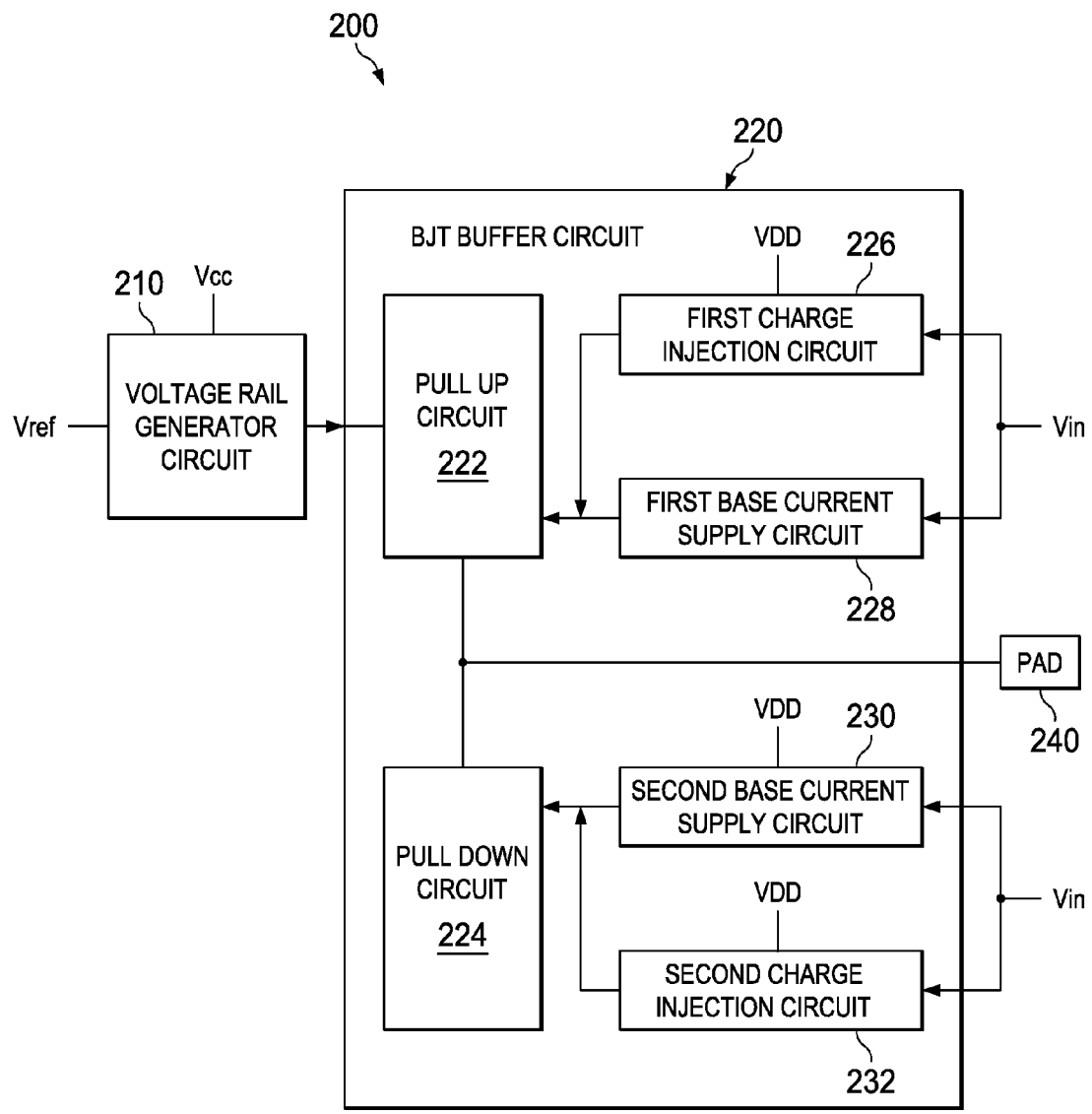
FIG. 2 illustrates a block diagram of an input/output (IO) circuit, according to an embodiment.

FIG. 2 illustrates a block diagram of an input/output (IO) circuit 200, according to an embodiment. The IO circuit 200 includes a voltage rail generator circuit 210. The voltage rail generator circuit 210 is powered by a supply voltage VCC and receives a reference voltage Vref. A BJT buffer circuit 220 is coupled to the voltage rail generator circuit 210. A pad 240 is coupled to the BJT buffer circuit 220. The BJT buffer circuit 220 includes a pull-up circuit 222. The pull-up circuit 222 is coupled to the voltage rail generator circuit 210. A pull-down circuit 224 is coupled to the pull-up circuit 222. The pad 240 is coupled to the pull-up circuit 222 and the pull-down circuit 224. A first charge injection circuit 226 and a first base current supply circuit 228 are coupled to the pull-up circuit 222. The first charge injection circuit 226 and the first base current supply circuit 228 are driven by an input signal Vin. The first charge injection circuit 226 also receives a core supply VDD. The input signal Vin has a swing equivalent to the core supply VDD. A second charge injection circuit 232 and a second base current supply circuit 230 are coupled to the pull-down circuit 224. The second charge injection circuit 232 and the second base current supply circuit 230 receive the input signal Vin and the core supply VDD. The operation of IO circuit 200 is explained with the help of FIG. 3 in the following paragraphs.

Figure 3:
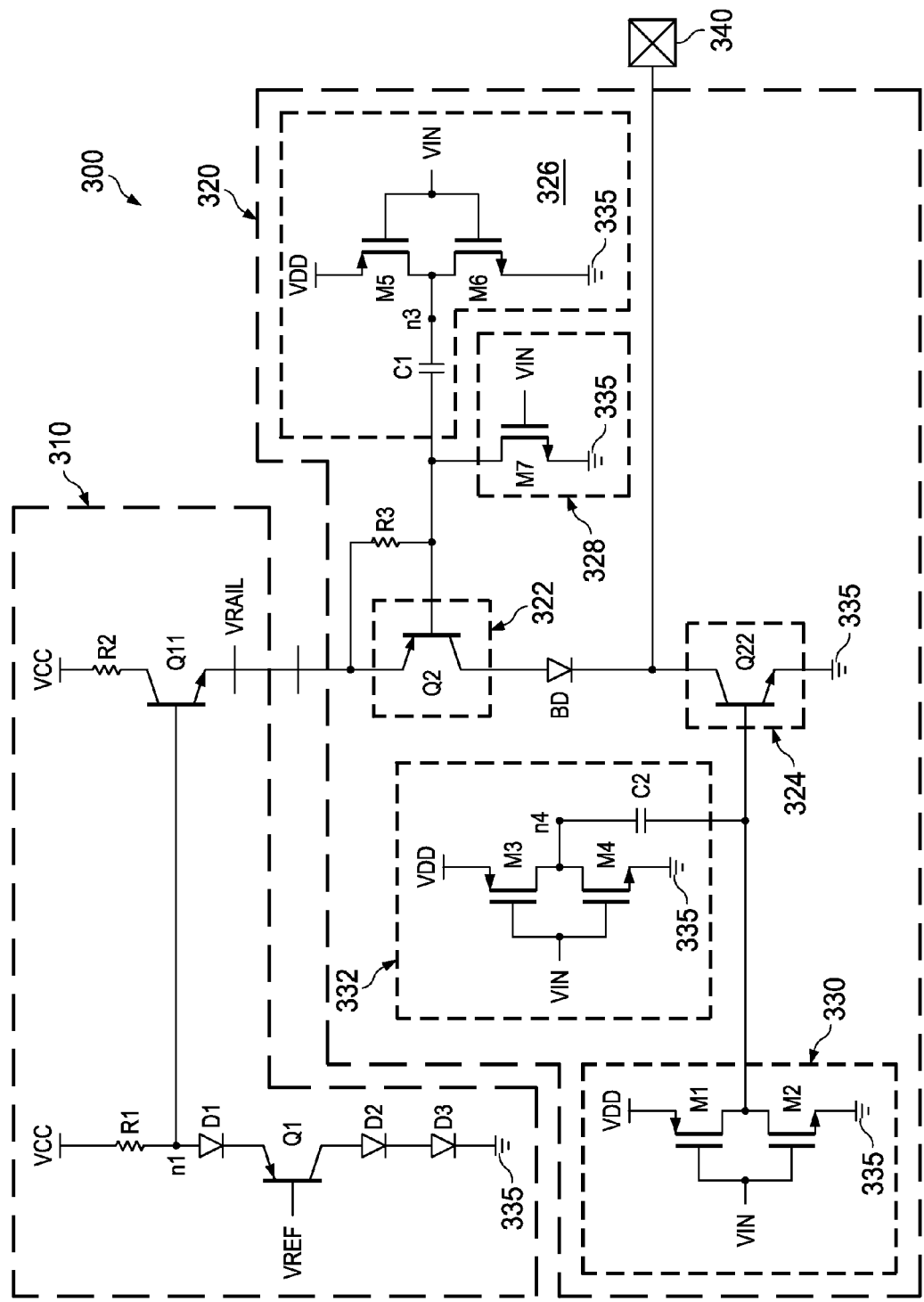
FIG. 3 illustrates a schematic of an input/output (IO) circuit, according to an embodiment.

FIG. 3 illustrates a schematic of an input/output (IO) circuit 300, according to an embodiment. The input/output (IO) circuit 300 is similar in connections and operation to the input/output (IO) circuit 200. The IO circuit 300 is one of the many ways of implementing IO circuit 200. The IO circuit 300 is powered by a supply voltage VCC. In one embodiment, supply voltage VCC is equal to 5 volt. The IO circuit 300 also receives an input signal Vin and a reference voltage Vref. The IO circuit 300 includes a voltage rail generator circuit 310. The voltage rail generator circuit 310 is powered by a supply voltage VCC and receives a reference voltage Vref. The voltage rail generator circuit 310 includes a first resistor R1 and a second resistor R2, both arranged to receive the supply voltage VCC. The first resistor R1 is coupled to a node n1. A first diode D1 is coupled to the node n1. The node n1 is an input terminal of the first diode D1. Thus, the first resistor R1 is coupled to the input terminal of the first diode D1. A first PNP transistor Q1 is coupled to an output terminal of the first diode D1. The first PNP transistor Q1 receives a reference voltage Vref at a base terminal of the first PNP transistor Q1. A plurality of diodes, such as diodes D2, D3 is coupled to a collector terminal of the first PNP transistor Q1. A first NPN transistor Q11 is coupled to the node n1 or the input terminal of the first diode D1. The second resistor R2 is coupled to a collector terminal of the first NPN transistor Q11. An emitter terminal of the first NPN transistor Q11 is coupled to a BJT buffer circuit 320.

The BJT buffer circuit 320 is coupled to the voltage rail generator circuit 310. A pad 340 is coupled to the BJT buffer circuit 320. The BJT buffer circuit 320 includes a pull-up circuit 322, a pull-down circuit 324, a first charge injection circuit 326, a first base current supply circuit 328, a second charge injection circuit 332 and a second base current supply circuit 330. The pull-up circuit 322 includes a second PNP transistor Q2. The pull-up circuit 322 is coupled to the voltage rail generator circuit 310. The first charge injection circuit 326 and the first base current supply circuit 328 are coupled to the pull-up circuit 322. The first charge injection circuit 326 and the first base current supply circuit 328 receive an input signal Vin. The first charge injection circuit 326 also receives a core supply VDD. An emitter terminal of the second PNP transistor Q2 is coupled to the emitter terminal of the first NPN transistor Q11 in the voltage rail generator circuit 310. The second PNP transistor Q2 receives the voltage rail supply at the emitter terminal. A base terminal of the second PNP transistor Q2 is coupled to the first base current supply circuit 328 and the first charge injection circuit 326. A resistor R3 is coupled between the emitter terminal of the second PNP transistor Q2 and the base terminal of the second PNP transistor Q2. A collector terminal of the second PNP transistor Q2 is coupled to an input terminal of a blocking diode BD. The blocking diode BD is coupled between the pull-up circuit 322 and the pull-down circuit 324.

The first charge injection circuit 326 includes a p-channel MOSFET M5, an n-channel MOSFET M6 and a capacitor C1. The p-channel MOSFET (metal-oxide-semiconductor field-effect transistor) M5 receives a core supply VDD. The input signal Vin has a swing equivalent to the core supply VDD. The n-channel MOSFET M6 coupled to the p-channel MOSFET M5. A gate terminal of the p-channel MOSFET M5 and a gate terminal of the n-channel MOSFET M6 receive the input signal Vin. A drain terminal of the p-channel MOSFET M5 and a drain terminal of the n-channel MOSFET M6 share a common node n3. A capacitor C1 is coupled to the node n3. The capacitor C1 is coupled to the base terminal of the second PNP transistor Q2. The first base current supply circuit 328 includes a drain-extended NMOS (DENMOS) M7 configured to receive the input signal Vin at a gate terminal of the drain-extended NMOS M7. A drain terminal of the drain-extended NMOS M7 is coupled to the base terminal of the second PNP transistor Q2. In one embodiment, drain-extended NMOS M7 is an n-channel MOSFET. A source terminal of the drain-extended NMOS M7 is coupled to a ground terminal 335. In one embodiment, a resistor is coupled between the source terminal of the drain-extended NMOS M7 and the ground terminal 335.

The blocking diode BD is coupled between the pull-up circuit 322 and the pull-down circuit 324. The pull-down circuit 324 includes a second NPN transistor Q22. A collector terminal of the second NPN transistor Q22 is coupled to an output terminal of the blocking diode BD. The pad 340 is coupled to the output terminal of the blocking diode BD. A base terminal of the second NPN transistor Q22 is coupled to the second base current supply circuit 330 and the second charge injection circuit 332. An emitter terminal of the second NPN transistor Q22 is coupled to the ground terminal 335.

The second charge injection circuit 332 includes a p-channel MOSFET M3, an n-channel MOSFET M4 and a capacitor C2. The p-channel MOSFET (metal-oxide-semiconductor field-effect transistor) M3 receives a core supply VDD. The n-channel MOSFET M4 is coupled to the p-channel MOSFET M3. A gate terminal of the p-channel MOSFET M3 and a gate terminal of the n-channel MOSFET M4 receive the input signal Vin. A drain terminal of the p-channel MOSFET M3 and a drain terminal of the n-channel MOSFET M4 share a common node n4. A capacitor C2 is coupled to the node n4. The capacitor C2 is coupled to the base terminal of the second NPN transistor Q22.

The second base current supply circuit 330 includes a p-channel MOSFET (metal-oxide-semiconductor field-effect transistor) M1 configured to receive a core supply VDD. An n-channel MOSFET M2 is coupled to the p-channel MOSFET M1. A gate terminal of the p-channel MOSFET M1 and a gate terminal of the n-channel MOSFET M2 are configured to receive the input signal Vin. A drain terminal of the p-channel MOSFET M1 and a drain terminal of the n-channel MOSFET M2 are coupled to the base terminal of the second NPN transistor Q22.

The operation of the input/output (IO) circuit 300 illustrated in FIG. 3 is explained now. In one embodiment, the supply voltage VCC is equal to 5 volt and the input signal Vin swings from 0-1.8V. The reference voltage Vref may be 1.8V, 2.5V or 3.3V (depending on signaling modes). In an embodiment, the p-channel MOSFET and n-channel MOSFET are 1.8 volt devices and the first PNP transistor Q1, first NPN transistor Q11, second PNP transistor Q2 and second NPN transistor Q22 are 3 volt devices. A current flows through the resistor R1, a first diode D1 and a first PNP transistor Q1. If voltage drop across base-emitter junction of each bipolar transistor in IO circuit 300 is Vbe and voltage drop across the first diode D1 is Vd1, the voltage developed at node n1 is equal to (Vn1=Vref+Vbe+Vd1). Vn1 is the voltage developed at the node n1. The voltage rail supply Vrail generated at the emitter terminal of the first NPN transistor Q11 is given by $$Vrail = Vn1 - Vbe \qquad (4)$$

$$Vrail = Vref + Vd1 \qquad (5)$$

Thus, the voltage rail generator circuit 310 receives a reference voltage Vref and generates the voltage rail supply Vrail. When the reference voltage Vref is 1.8V, 2.5V or 3.3V, the corresponding Vrail generated is 2.5V, 3.3V or 4V (assuming voltage drop across the first diode D1 (Vd1) is 0.7V). The first NPN transistor Q11 takes small current through the base terminal and generates large currents through Vrail. The plurality of diodes D2 and D3 limits the voltage drop across the collector-emitter terminal of the first PNP transistor Q1.

During pull-up i.e. when the input signal Vin transitions from logic-LOW to logic-HIGH, the second PNP transistor Q2 is activated and the second NPN transistor Q22 is inactivated. The first charge injection circuit 326 injects current in the second PNP transistor Q2 to activate the second PNP transistor Q2 when the input signal Vin transitions from logic-LOW to logic-HIGH. When the input signal Vin transitions from logic-LOW to logic-HIGH, the p-channel MOSFET M5 is inactivated and the n-channel MOSFET M6 is activated such that the node n3 transitions from logic-HIGH to logic-LOW. The capacitor C1 couples this transition at node n3 to the base terminal of the second PNP transistor Q2, thereby providing a burst of current to activate the second PNP transistor Q2. The capacitor C1 assists in fast charge/discharge of parasitic capacitances of the second PNP transistor Q2. The first base current supply circuit 328 provides a current to keep the second PNP transistor Q2 active after activation by the first charge injection circuit 326. The current provided by the first base current supply circuit 328 is a small static current required to maintain the second PNP transistor Q2 active. The first base current supply circuit 328 comprises a drain-extended NMOS (DENMOS) M7. A regular NMOS is not used in the first base current supply circuit 328 because regular NMOS cannot tolerate a high voltage at a base terminal of the second PNP transistor Q2. In an embodiment, a resistor coupled to the source terminal of the DENMOS M7 is used to control the current provided to the base terminal of the second PNP transistor Q2. However, DENMOS M7 is a slow device and incapable of activating/inactivating the second PNP transistor Q2 at a fast rate when devices are working at a frequency range of 100 MHz. The resistor R3 also cannot inactivate the second PNP transistor Q2 at a fast rate. The first charge injection circuit 326 is responsible to activate/inactivate the second PNP transistor Q2 at a fast rate when the devices are working at a frequency range of 100 MHz.

Also, during pull-up, when the input signal Vin transitions from logic-LOW to logic-HIGH, p-channel MOSFET M1 is inactivated and n-channel MOSFET M2 is activated. Thus, the base terminal of the second NPN transistor Q22 is connected to the ground terminal 335 through the n-channel MOSFET M2. Thus, during pull-up, the second PNP transistor Q2 is activated and the second NPN transistor Q22 is inactivated. The pad 340 is charged to the supply rail voltage Vrail minus the voltage drop across the blocking diode BD. In absence of the blocking diode BD, the pad 340 is charged to the supply rail voltage Vrail.

During pull-down i.e. when the input signal Vin transitions from logic-HIGH to logic-LOW, the second PNP transistor Q2 is inactivated and the second NPN transistor Q22 is activated. When Vin transitions from logic-HIGH to logic-LOW, the first charge injection circuit 326 couples the voltage transition to the base terminal of the second PNP transistor Q2 resulting in inactivation of the second PNP transistor Q2. Thereafter, the resistor R3 shorts the base terminal and the emitter terminal of the second PNP transistor Q2 thus maintaining the second PNP transistor Q2 in inactive state.

The second charge injection circuit 332 injects current in the second NPN transistor Q22 to activate the second NPN transistor Q22 when the input signal Vin transitions from logic-HIGH to logic-LOW. When the input signal Vin transitions from logic-HIGH to logic-LOW, the p-channel MOSFET M3 is activated and the n-channel MOSFET M4 is inactivated such that the node n4 transitions from logic-LOW to logic-HIGH. The capacitor C2 couples this transition at the node n4 to the base terminal of the second NPN transistor Q22, thereby providing a burst of current to activate the second NPN transistor Q22. The capacitor C2 assists in fast charge/discharge of parasitic capacitances of the NPN transistor Q22. The second base current supply circuit 330 provides a current to keep the second NPN transistor Q22 active after activation by the second charge injection circuit 332. The current provided by the second base current supply circuit 330 is a small static current required to maintain the second NPN transistor Q22 active. In absence of the second charge injection circuit 332, the second NPN transistor Q22 requires a much larger static current thus impacting power requirement of the IO circuit 300. Also, the small static current assists in eliminating latch-up risk when the second NPN transistor Q22 is in hard saturation condition. The n-channel MOSFET M1 is activated and the p-channel MOSFET M2 is inactivated, when input signal Vin is at logic-LOW. A continuous current is provided to the base terminal of second NPN transistor Q22 through M1. Thus, during pull-down, the second PNP transistor Q2 is inactivated and the second NPN transistor Q22 is activated. The pad 340 gets discharged to a ground voltage (voltage at ground terminal 335) through the second NPN transistor Q22.

It is to be noted that splitting the IO circuit 300 into voltage rail generator circuit 310 and the BJT buffer circuit 320 allows the supply voltage VCC to be distributed between Q11, Q2 and Q22. This prevents any single device to get exposed to the supply voltage VCC which can be of the order of 5 volt. This ensures that all devices in IO circuit 300 are in a safe operating region. In an embodiment VCC is equal to 5 volt and maximum voltage across all bipolar transistors (Q1, Q11, Q2, and Q22) is ensured to be below 3.3V.

During receive mode, test mode or a mode when the IO circuit 300 is not driving signal on the pad 340 (tristate mode), a high voltage at the pad 340 can damage the IO circuit 300. In one embodiment, a voltage above 3.3 volt is considered as high voltage. In an embodiment, a voltage above the voltage specification of the second PNP transistor Q2, and the second NPN transistor Q22 is considered as high voltage. When the pad 340 is at high voltage, n-channel MOSFET M2 shorts the base terminal and emitter terminal of the second NPN transistor Q22 thus protecting it from overstress. During high voltage condition at the pad 340, a hot carrier multiplication of the reverse saturation current starts at the collector-base junction of the second NPN transistor Q22. However, this reverse saturation current is bypassed through the n-channel MOSFET M2 to the ground terminal 335. This arrangement prevents forward biasing of a base-emitter junction of the second NPN transistor Q22 thus eliminating a high forward bias current to be part of avalanche multiplication. This allows second NPN transistor Q22 to withstand much higher voltages than BVECO rating (break-down voltage of collector-emitter junction with base open circuit rating). The blocking diode BD protects a top portion of the IO circuit 300. A high voltage at the pad 340 reverse bias the blocking diode BD. In case, blocking diode BD is not present, a high voltage at the pad 340 would forward bias the collector-base junction of the second PNP transistor Q2 resulting in leakage current through the pad 340 to the second PNP transistor Q2. In one embodiment, the blocking diode BD is constructed using an NPN transistor and coupling a base and an emitter terminal of the NPN transistor.

The IO circuit 300 is capable of high voltage signaling in a low voltage BiCMOS process for example 3.3 volt BiCMOS process. The IO circuit 300 is also capable of withstanding high voltage stress at the pad 340. Since low voltage BiCMOS process does not support high voltage MOS devices for example 3.3/2.5 volt MOS transistors, the IO circuit 300 makes use of bipolar devices to overcome the shortcoming of low voltage BiCMOS process. This enables the IO circuit 300 to be used for low voltage BiCMOS process without using the extra mask-set for high voltage MOS transistor and thereby reducing the cost significantly. In addition, the IO circuit 300 works using supply voltage and does not require a separate IO supply. In an embodiment, the IO circuit 300 works on 5 volt supply voltage and does not require an LDO (linear drop-out) regulator to generate a separate IO supply which is less than 5 volt. The IO circuit 300 also supports multivoltage signaling. In an embodiment, the IO circuit 300 supports 1.8/2.5/3.3 signaling modes and is capable of working at high frequencies in the range of 100 MHz.

Figure 4:
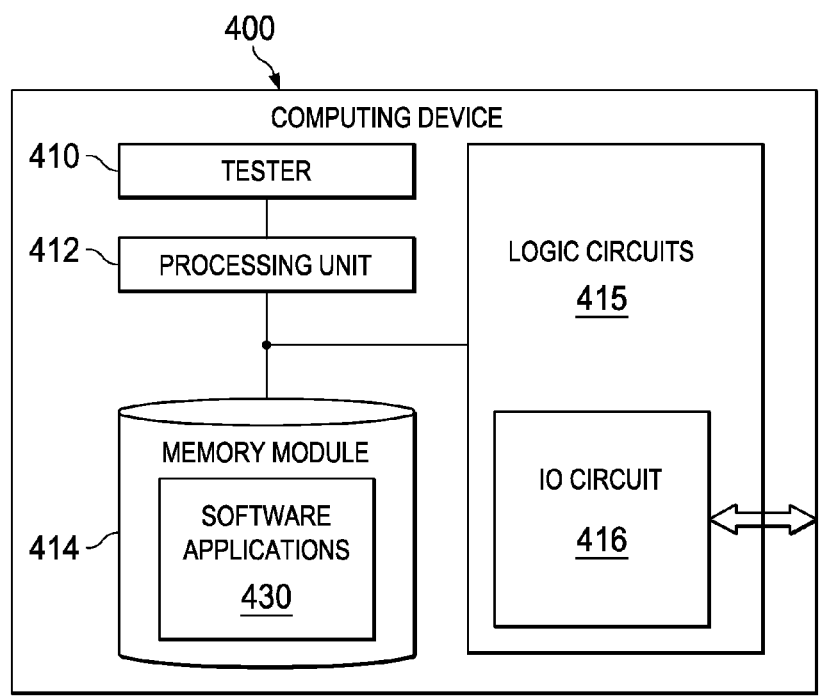
FIG. 4 illustrates a computing device according to an embodiment.

FIG. 4 illustrates a computing device according to an embodiment. The computing device 400 is, or is an integrated circuit incorporated into, a server farm, a computing device with hard-drive, a video recorder, a set top box, a mobile communication device, such as a mobile phone, a personal digital assistant, a personal computer, or any other type of electronic system.

In some embodiments, the computing device 400 can be one of, but not limited to, microcontroller, microprocessor or a system-on-chip (SoC) which includes a processing unit 412 such as a CPU (Central Processing Unit), a memory module 414 (e.g., random access memory (RAM)) and a tester 410. The processing unit 412 can be, for example, a CISC-type (Complex Instruction Set Computer) CPU, RISC-type CPU (Reduced Instruction Set Computer), or a digital signal processor (DSP). The memory module 414 (which can be memory such as RAM, flash memory, or disk storage) stores one or more software applications 430 (e.g., embedded applications) that, when executed by the processing unit 412, perform any suitable function associated with the computing device 400. The tester 410 comprises logic that supports testing and debugging of the computing device 400 executing the software applications 430. For example, the tester 410 can be used to emulate a defective or unavailable component(s) of the computing device 400 to allow verification of how the component(s), were it actually present on the computing device 400, would perform in various situations (e.g., how the component(s) would interact with the software applications 430). In this way, the software applications 430 can be debugged in an environment which resembles post-production operation.

The processing unit 412 typically comprises cache-memory and logic which store and use information frequently accessed from the memory module 414 and is responsible for the complete functionality of the computing device 400. The computing device 400 includes a plurality of logic circuits 415. At least one logic circuit of the plurality of logic circuits 415 includes an IO circuit 416. The IO circuit 416 acts as an interface between the computing device 400 and the external world. The IO circuit 416 is analogous to the IO circuit 300 in connection and operation. The IO circuit 416 is capable of high voltage signaling in a low voltage BiCMOS process for example 3.3 volt BiCMOS process. The IO circuit 416 can also withstand high voltage overstress at a pad. Since low voltage BiCMOS process does not support high voltage MOS devices for example 3.3/2.5 volt MOS transistors, the IO circuit 416 makes use of bipolar devices to overcome the shortcoming of low voltage BiCMOS process. This enables the IO circuit 416 to be used for low voltage BiCMOS process without using the extra mask-set for high voltage MOS transistor and thereby reducing the cost significantly. In addition, the IO circuit 416 works using supply voltage and does not require a separate IO supply. In an embodiment, the IO circuit 416 works on 5 volt supply voltage and does not require an LDO (linear drop-out) regulator to generate a separate IO supply which is less than 5 volt. The IO circuit 416 also supports multivoltage signaling. In an embodiment, the IO circuit 416 supports 1.8/2.5/3.3 signaling modes and is capable of working at high frequencies in the range of 100 MHz.

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "connected to" or "connected with" (and the like) are intended to describe either an indirect or direct electrical connection. Thus, if a first device is coupled to a second device, that connection can be through a direct electrical connection, or through an indirect electrical connection via other devices and connections. Further, the term "logic-HIGH" is generally intended to describe a signal that is at logic state "1," and the term "logic-LOW" is generally intended to describe a signal that is at logic state "0." Also, the terms "OFF state" or turn "OFF" or turned "OFF" is used to describe a deactivation of a device, a component or a signal. The term turned "ON" describes activation of a device, a component or a signal.

It should be noted that reference throughout this specification to features, advantages, or similar language does not imply that all of the features and advantages should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Further, the described features, advantages, and characteristics of the disclosure may be combined in any suitable manner in one or more embodiments. One skilled in the relevant art will recognize that the disclosure can be practiced without one or more of the specific features or advantages of a particular embodiment. In other instances, additional features and advantages may be recognized in certain embodiments that may not be present in all embodiments of the disclosure.

One having ordinary skill in the art will understand that the present disclosure, as discussed above, may be practiced with steps and/or operations in a different order, and/or with hardware elements in configurations which are different than those which are disclosed. Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. An input/output (IO) circuit comprising:
   a voltage rail generator circuit configured to receive a reference voltage and configured to generate a voltage rail supply;
   a BJT (bi-polar junction transistor) buffer circuit coupled to the voltage rail generator circuit and a pad, wherein the BJT buffer circuit further comprises:
   a pull-up circuit configured to receive the voltage rail supply;
   a pull-down circuit coupled to the pull-up circuit, wherein the pad is coupled to the pull-up circuit and the pull-down circuit;
   a first base current supply circuit coupled to the pull-up circuit and configured to receive an input signal; and
   a second base current supply circuit coupled to the pull-down circuit and configured to receive the input signal and a core supply; a first charge injection circuit coupled to the pull-up circuit and configured to receive the input signal and the core supply; a second charge injection circuit coupled to the pull-down circuit and configured to receive the input signal and the core supply; and a blocking diode coupled between the pull-up circuit and the pull-down circuit.

2. The IO circuit of claim 1, wherein the voltage rail generator circuit further comprises:
   a first resistor and a second resistor configured to receive a supply voltage;
   an input terminal of a first diode coupled to the first resistor;
   a first PNP transistor configured to receive the reference voltage, wherein an output terminal of the first diode is coupled to an emitter terminal of the first PNP transistor;
   a plurality of diodes coupled to a collector terminal of the first PNP transistor; and
   a first NPN transistor coupled to the input terminal of the first diode, wherein the second resistor is coupled to a collector terminal of the first NPN transistor and the voltage rail supply is generated at an emitter terminal of the first NPN transistor.

3. The IO circuit of claim 1, wherein the pull-up circuit comprises a second PNP transistor and the pull-down circuit comprises a second NPN transistor.

4. The IO circuit of claim 3 further comprising:
   an emitter terminal of the second PNP transistor configured to receive the voltage rail supply;
   a base terminal of the second PNP transistor coupled to the first base current supply circuit and the first charge injection circuit;
   a resistor coupled between the emitter terminal of the second PNP transistor and the base terminal of the second PNP transistor; and
   a collector terminal coupled to an input terminal of the blocking diode.

5. The IO circuit of claim 1 further comprising:
a collector terminal of the second NPN transistor coupled to an output terminal of the blocking diode;
a base terminal of the second NPN transistor coupled to the second base current supply circuit and the second charge injection circuit; and
an emitter terminal of the second NPN transistor coupled to a ground terminal.

6. The IO circuit of claim 3, wherein the pad is coupled to the output terminal of the blocking diode.

7. The IO circuit of claim 1, wherein the first charge injection circuit and the second charge injection circuit comprises:
a p-channel MOSFET (metal-oxide-semiconductor field-effect transistor) configured to receive a core supply;
an n-channel MOSFET coupled to the p-channel MOSFET, wherein a gate terminal of the p-channel MOSFET and a gate terminal of the n-channel MOSFET are configured to receive the input signal; and
a capacitor coupled to a drain terminal of the p-channel MOSFET and a drain terminal of the n-channel MOSFET.

8. The IO circuit of claim 7, wherein the capacitor in the first charge injection circuit is coupled to the base terminal of the second PNP transistor and the capacitor in the second charge injection circuit is coupled to the base terminal of the second NPN transistor.

9. The IO circuit of claim 1, wherein the first base current supply circuit comprises a drain-extended NMOS configured to receive the input signal, wherein a drain terminal of the drain-extended NMOS is coupled to the base terminal of the second PNP transistor.

10. The IO circuit of claim 1, wherein the second base current supply circuit comprises
a p-channel MOSFET (metal-oxide-semiconductor field-effect transistor) configured to receive a core supply; and
an n-channel MOSFET coupled to the p-channel MOSFET, wherein:
a gate terminal of the p-channel MOSFET and a gate terminal of the n-channel MOSFET are configured to receive the input signal; and
a drain terminal of the p-channel MOSFET and a drain terminal of the n-channel MOSFET are coupled to the base terminal of the second NPN transistor.

11. The IO circuit of claim 1, wherein the p-channel MOSFET and the n-channel MOSFET are 1.8 volt devices and the first PNP transistor, the first NPN transistor, the second PNP transistor and the second NPN transistor are 3 volt devices.

12. A method comprising:
generating a voltage rail supply from a reference voltage;
injecting current in a second PNP transistor to activate the second PNP transistor when an input signal transitions from logic-LOW to logic-HIGH;
configuring a first base current supply circuit to receive the input signal and provide current to the second PNP transistor after activation of the second PNP transistor;
charging a pad to the supply rail voltage;
injecting current in a second NPN transistor to activate the second NPN transistor when the input signal transitions from logic-HIGH to logic-LOW;
configuring a second base current supply circuit to receive the input signal and provide current to the second NPN transistor after activation of the second NPN transistor; and
discharging the pad to a ground voltage.

13. The method of claim 12, wherein the first base current supply comprises a drain-extended NMOS configured to receive the input signal, wherein a drain terminal of the drain-extended NMOS is coupled to the base terminal of the second PNP transistor.

14. The method of claim 12, wherein the second base current supply circuit comprises:
a p-channel MOSFET (metal-oxide-semiconductor field-effect transistor) configured to receive a core supply; and
an n-channel MOSFET coupled to the p-channel MOSFET, wherein:
a gate terminal of the p-channel MOSFET and a gate terminal of the n-channel MOSFET are configured to receive the input signal; and
a drain terminal of the p-channel MOSFET and a drain terminal of the n-channel MOSFET are coupled to a base terminal of the second NPN transistor.

15. The method of claim 12 further comprising blocking a leakage current from the second PNP transistor by a blocking diode coupled between the second PNP transistor and the second NPN transistor when a voltage at the pad is above a voltage specification of the second PNP transistor and the second NPN transistor.

16. The method of claim 12 further comprising coupling the base terminal of the second NPN transistor to the ground terminal through the n-channel MOSFET such that an excess current generated in the second NPN transistor is passed to the ground terminal whereby reducing stress on the second NPN transistor, when a voltage at the pad is above a voltage specification of the second PNP transistor and the second NPN transistor.

17. A computing device comprising:
a processing unit;
a memory module coupled to the processing unit; and
a plurality of logic circuits coupled to the processing unit and the memory module; and
an IO circuit coupled to atleast one logic circuit of the plurality of logic circuits, the IO circuit comprising:
a voltage rail generator circuit configured to receive a reference voltage and configured to generate a voltage rail supply;
a BJT (bi-polar junction transistor) buffer circuit coupled to the voltage rail generator circuit and a pad, wherein the BJT buffer circuit further comprises:
a second PNP transistor configured to receive the voltage rail supply;
a second NPN transistor coupled to the second PNP transistor, wherein the pad is coupled to the second PNP transistor and the second NPN transistor;
a first base current supply circuit and a first charge injection circuit coupled to the second PNP transistor, wherein the first base current supply circuit and the first charge injection circuit are configured to receive an input signal;
a second base current supply circuit and a second charge injection circuit coupled to the second NPN transistor, wherein the second base current supply circuit and the second charge injection circuit are configured to receive the input signal, and the first charge injection circuit and the second charge injection circuit configured to receive a core supply; and
a blocking diode coupled between the second PNP transistor and the second NPN transistor.

18. The computing device of claim 17, wherein the voltage rail generator circuit further comprises:
a first resistor and a second resistor configured to receive the supply voltage;
an input terminal of a first diode coupled to the first resistor;

a first PNP transistor configured to receive the reference voltage, wherein an output terminal of the first diode is coupled to an emitter terminal of the first PNP transistor;

a plurality of diodes coupled to a collector terminal of the first PNP transistor; and a first NPN transistor coupled to an input terminal of the first diode, wherein the second resistor is coupled to a collector terminal of the first NPN transistor and the voltage rail supply is generated at an emitter terminal of the first NPN transistor.

19. The computing device of claim 17, wherein the first charge injection circuit and the second charge injection circuit comprises:

a p-channel MOSFET (metal-oxide-semiconductor field-effect transistor) configured to receive the core supply;

an n-channel MOSFET coupled to the p-channel MOSFET, wherein a gate terminal of the p-channel MOSFET and a gate terminal of the n-channel MOSFET are configured to receive the input signal; and a capacitor coupled to a drain terminal of the p-channel MOSFET and a drain terminal of the n-channel MOSFET, wherein the capacitor in the first charge injection circuit is coupled to the base terminal of the second PNP transistor and the capacitor in the second charge injection circuit is coupled to the base terminal of the second NPN transistor.

20. The computing device of claim 17, wherein:

the first base current supply circuit comprises a drain-extended NMOS configured to receive the input signal, wherein a drain terminal of the drain-extended NMOS is coupled to the base terminal of the second PNP transistor; and the second base current supply circuit comprises:

a p-channel MOSFET (metal-oxide-semiconductor field-effect transistor) configured to receive a core supply; and an n-channel MOSFET coupled to the p-channel MOSFET, wherein:

a gate terminal of the p-channel MOSFET and a gate terminal of the n-channel MOSFET are configured to receive the input signal; and a drain terminal of the p-channel MOSFET and a drain terminal of the n-channel MOSFET are coupled to the base terminal of the second NPN transistor.

* * * * *